(12) United States Patent
Koshido

(10) Patent No.: US 6,358,429 B1
(45) Date of Patent: Mar. 19, 2002

(54) ELECTRONIC DEVICE AND METHOD FOR PRODUCING THE SAME

(75) Inventor: Yoshihiro Koshido, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/354,481

(22) Filed: Jul. 16, 1999

(30) Foreign Application Priority Data

Aug. 5, 1998 (JP) ............................................. 10-221533

(51) Int. Cl.$^7$ ......................................... H01L 21/3065
(52) U.S. Cl. ........................... 216/67; 216/72; 438/738; 438/740; 438/742
(58) Field of Search .............................. 216/49, 67, 72, 216/77; 438/738, 740, 742

(56) References Cited

U.S. PATENT DOCUMENTS

| | | | | |
|---|---|---|---|---|
| 4,966,870 A | * | 10/1990 | Barber et al. ................ | 437/228 |
| 5,106,471 A | | 4/1992 | Galvin et al. .......... | 204/192.35 |
| 5,270,254 A | * | 12/1993 | Chen et al. .................. | 437/190 |
| 5,378,653 A | | 1/1995 | Yanagida .................... | 437/194 |
| 5,472,774 A | * | 12/1995 | Goad et al. .................. | 428/209 |
| 5,533,635 A | * | 7/1996 | Man ............................. | 216/67 |
| 5,837,617 A | * | 11/1998 | Oguri et al. ................. | 438/738 |
| 5,858,879 A | * | 1/1999 | Chao et al. .................. | 438/725 |
| 5,904,569 A | * | 5/1999 | Kitch .......................... | 438/692 |
| 6,054,348 A | * | 4/2000 | Lin et al. ..................... | 438/257 |

FOREIGN PATENT DOCUMENTS

| | | |
|---|---|---|
| EP | 0936734 A1 | 8/1999 |
| JP | 60-218847 A | * 11/1985 |
| JP | 03-105921 A | * 5/1991 |
| JP | 04-365211 A | * 12/1992 |
| JP | 09213678 | 8/1997 |

* cited by examiner

Primary Examiner—Anita Alanko
(74) Attorney, Agent, or Firm—Ostrolenk, Faber, Gerb & Soffen, LLP

(57) ABSTRACT

A method for manufacturing an electronic device includes the steps of: forming a base film comprising a material capable of reactive-ion etching with a fluorine-based gas on a substrate; forming a thin film comprising a material capable of reactive-ion etching with a chlorine-based gas on the base film; etching the thin film by a reactive ion etching with a gas containing the chlorine-based gas; and etching the base film exposed by the etched thin film by a reactive ion etching with a gas containing the fluorine-based gas.

6 Claims, 2 Drawing Sheets

ELECTRONIC DEVICE AND METHOD FOR PRODUCING THE SAME

BACKGROUND OF THE INVENTION

1. Field of the Invention

The present invention relates to an electronic device and a method for producing the same. In more detail, the present invention relates to an electronic device such as a semiconductor integrated circuit, a semiconductor device or a surface acoustic wave (SAW) device, and a method for producing the same.

2. Description of the Related Art

Various electronic devices comprise patterned electrodes or metallization on a substrate. For example, in the case of a surface acoustic wave device, an aluminum electrode is formed on a single crystal piezoelectric substrate by a reactive ion etching (RIE). More specifically, as shown in FIGS. 1A and 1B, a surface of an electrode film 2 provided on a single crystal piezoelectric substrate 1 is covered with a photoresist 3, and the electrode film 2 is selectively etched using a chlorine-based gas such as $Cl_2$ or $BCl_3$ and a patterned photoresist 3 as a mask. However, the electrode film 2 is not always completely removed and is sometimes left behind on the single crystal substrate 1 owing to heterogeneous distributions of the film thickness of the electrode film 2 or reactive ion etching rate on the surface of the single crystal substrate 1 as shown in FIG. 1A. A residue eliminating process called over-etching becomes therefore inevitable in order to completely remove the electrode film 2 without leaving any residue behind. As shown in FIG. 1B, an over-etching treatment by 5 to 50% excess of the overall etching time under the same etching condition is applied in the over-etching method, thereby slightly etching into the single crystal substrate 1.

However, the portions where the electrode film 2 has been removed and the single crystal substrate 1 has been exposed to chlorine plasma during the over-etching become exposed. Consequently, the single crystal substrate 1 is damaged, forming damaged layers 4 as shown in FIG. 2, thereby deteriorating characteristics of the acoustic surface wave device.

It has been a common view that the cause of the substrate damage due to over-etching as described above is a physical damage caused by impact of ions colliding with the substrate during the reactive-ion etching. Accordingly, the substrate damage due to ion irradiation has been suppressed by the following methods: (1) reducing the ion irradiation energy; (2) improving homogeneity of the ion etching rate; and (3) detecting the etching terminal point with high precision. However, it was impossible to completely inhibit the damage of the substrate by the conventional method, although it can be reduced.

SUMMARY OF THE INVENTION

The present invention is directed to a method that can solve the aforementioned problem and reduce the damage of the substrate by the reactive ion etching during production of an electronic device. The present invention is also directed to an electronic device prepared by the method and having a excellent device characteristics due to less substrate damage.

An electronic device comprises: a support selected form the group consisting of a single crystal substrate, single crystal film, triaxial orientation film or uniaxial orientation film; a lower electrode layer comprising a material capable of reactive-ion etching with a fluorine-based gas and formed on the support; and an upper electrode layer comprising a material capable of reactive-ion etching with a chlorine-based gas and formed on the lower electrode layer.

The method for manufacturing an electronic device, comprises the steps of: forming a base film comprising a material capable of reactive-ion etching with a fluorine-based gas, on e.g., either a single crystal substrate, single crystal film, triaxial orientation film or uniaxial orientation film; forming a thin film comprising a material capable of reactive-ion etching with a chlorine-based gas, on the base film; etching the thin film by reactive ion etching with a chlorine-based gas using a mask having a predetermined pattern; and etching the base film exposed by the etched thin film by a reactive ion etching with a gas containing the fluorine-based gas.

The base film or lower electrode layer preferably contains at least one element selected form the group consisting of Si, Mo, W, B, C, S and Ta and has a thickness of about 0.5 nm to 1000 nm. The support may comprise a piezoelectric material.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1A:
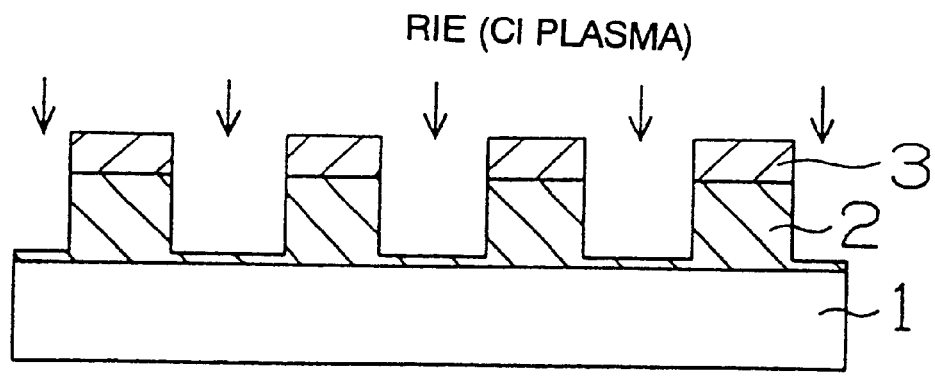
FIGS. 1A and 1B are cross sectional views showing the reactive ion etching steps using a chlorine-based gas in the conventional art.
Figure 1B:
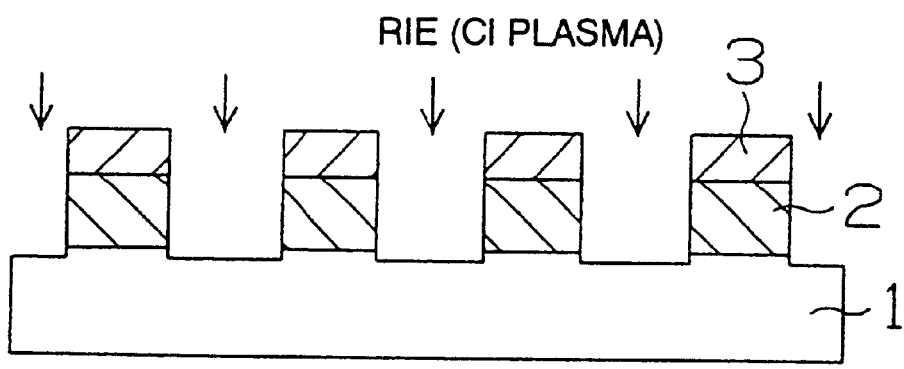
Figure 2:
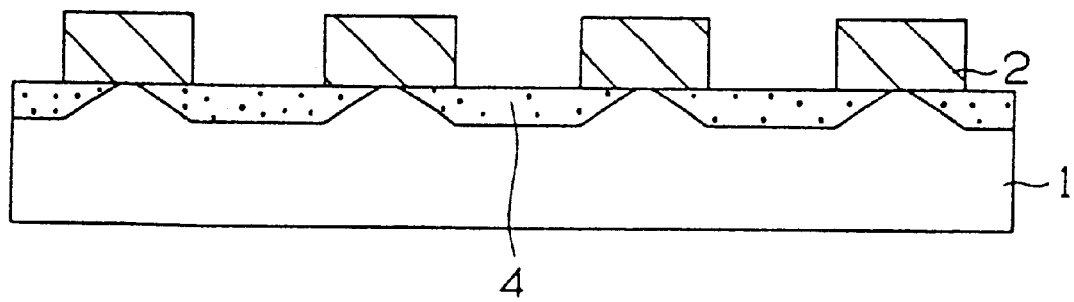
FIG. 2 is a cross sectional view of a substrate damaged by over-etching.

The inventor of the present invention have found, through collective studies, that the damage of the substrate is not simply caused by physical damage due to collision of ions onto the substrate, but is caused by a diffusion of chlorine species (ions, atoms, molecules or chlorine radicals) into the substrate. According to the study, it is thought that chlorine is diffused into the substrate by exposing the surface of the substrate to the chlorine ions during the reactive ion etching and destroys or impairs the crystallinity of the substrate. As a result, various properties which were appeared due to high crystallinity, such as piezoelectric properties, dielectric properties, pyroelectric properties, semiconductor properties, magnetic properties or the like are caused to degrade.

The method and the electronic device according to the present invention were based on the facts found by the inventors of the present invention, providing an electronic device in which a lower electrode layer comprising a material capable of reactive ion etching with a fluorine-based gas is formed on a single crystal substrate or single crystal film, or on a triaxial or uniaxial orientation film, and an upper electrode layer comprising a material capable of reactive ion etching with a chlorine-based gas being formed on the lower electrode layer. Functional single crystal materials such as piezoelectric materials, dielectric materials, pyroelectric materials, semiconductors materials and magnetic materials are used for the single crystal substrate or single crystal film, or for the triaxial or uniaxial orientation film depending on the kind of the electronic device.

According to the study by the inventor, the present invention is more preferably applied to an surface acoustic wave device having a piezoelectric substrate or film made of a material such as $LiTaO_3$, $LiNbO_3$, $Li_2B_4O_7$, quartz or $La_3Ga_5SiO_{14}$ (Langasite) and the manufacturing method thereof. This is because these materials are susceptible to chlorine diffusion by the reactive ion etching to result in degradation of the piezoelectric properties.

The chlorine-based gas used for the reactive ion etching refers to a gas containing chlorine, for example a gas containing at least one of $Cl_2$, $BCl_3$, $SiCl_4$, $CClF_3$, $CHClF_2$, $CCl_2F_2$, $CHCl_2F$, $CHCl_3$, $CCl_3F$ and $CH_2Cl_2$. On the other hand, the thin film formed on the single crystal substrate or single crystal film, or on the triaxial or uniaxial orientation film may be a conductive material or semiconductor containing at least one element capable of reactive ion etching with a chlorine-based gas, examples of which include at least one element among Al, Cu, Ti, Cr, Ga, As, Se, Nb, Ru, In, Sn, Sb, Ta and Au.

The electronic device is produced by forming a base film comprising a material capable of reactive etching with a fluorine-based gas and a thin film comprising a material capable of reactive etching with a chlorine-based gas on the single crystal substrate or single crystal film, or on the triaxial or uniaxial orientation film, followed by etching the thin film by reactive ion etching with a gas containing a chlorine-based gas, the base film exposed from the thin film being further subjected to the reactive ion etching with a gas containing a fluorine-based gas.

Since the base film capable of reactive ion etching with the fluorine-based gas is formed under the thin film, the reactive ion etching with a gas containing the chlorine-based gas is stopped when the base film is completely exposed in the etching area while applying the reactive ion etching with a gas containing the chlorine-based gas. The process described above allows chemical damage of the single crystal substrate or single crystal film, or of the triaxial or uniaxial orientation film with chlorine to be prevented.

For exposing the single crystal substrate or single crystal film, or the triaxial or uniaxial orientation film by removing the substrate layers, the thin film exposed by the reactive ion etching with a gas containing the chlorine-based gas is removed by the reactive ion etching with a gas containing the fluorine-based gas.

According to the studies by the inventors of the present invention, it was made clear that crystals in the single crystalline substrate or single crystalline film are not subjected to chemically damage when fluorine (ions, molecules, atoms or radicals of fluorine) is used. Accordingly, the single crystalline substrate or single crystal film is not damaged when the exposed substrate layer is further etched by the reactive ion etching with a gas containing the fluorine-based gas to expose the single crystal substrate or single crystal film, or to expose the triaxial or uniaxial orientation film, making it possible to stabilize device characteristics.

Since the damage of the substrate by the reactive ion etching had been considered to be a physical damage in the conventional view, the same sort of damage was also considered to be caused irrespective of the kind of gas. Accordingly, it was impossible in the prior art to completely suppress the damage of the substrate, through it may be somewhat reduced. In the method according to the present invention, on the contrary, damage of the substrate by the reactive ion etching can be prevented, enabling one to improve the characteristics of the electronic device.

The substrate capable of reactive ion etching with the fluorine-based gases contains at least one element among Si, Mo, W, B, C, S and Ta with a preferable film thickness of about 0.5 to 1000 nm and more preferably about 1–500 nm. The substrate with a thickness of thinner than about 0.5 nm may be perforated by the reactive ion etching with the chlorine-based gas while, when the thickness is larger than about 1000 nm, the processing time is prolonged or the processing accuracy is decreased.

The fluorine-based gas to be used for the reactive ion etching of the substrate may contain at least one kind of the gas among $CF_4$, $CHF_3$, $F_2$, $NF_3$, $CClF_3$, $C_2F_6$, $CBrF_3$, $CH_2F_2$, $CHClF_2$, $C_3F_8$, $CCl_2F_2$, $C_4F_8$, $CHCl_2F$, $CBr_2F_2$ and $CCl_3F$.

Figure 3A:
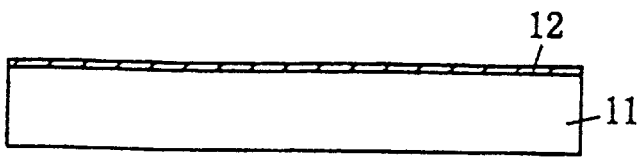
FIGS. 3A to 3F are cross sectional views showing the electrode forming steps according to one embodiment of the present invention.
Figure 3B:
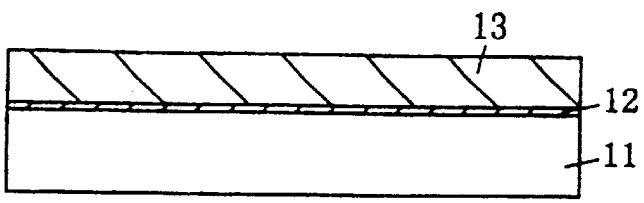
Figure 3C:
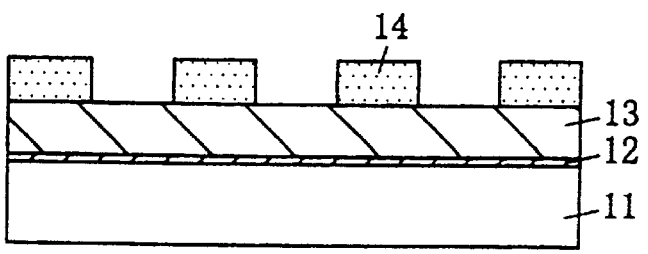

Hereinafter, a preferred embodiment of the present invention will be described in more detail with reference to the attached drawings using the acoustic surface wave device as an example. As shown in FIG. 3A, a base film 12 made of tungsten with a thickness of 10 nm is at first deposited by sputtering on a single crystalline $LiTaO_3$ substrate with a diameter of three inches. While the base film 12 is not exposed to the air (by keeping a vacuum in the sputtering apparatus), an electrode film 13 with a thickness of 100 nm consisting of Al containing 1% by weight (wt %) of Cu (referred to Al-1 wt %Cu hereinafter) is deposited by sputtering on the base film 12 as shown in FIG. 3B. Then, an Al-1 wt %Cu photoresist is coated on the electrode film 13 followed by forming a resist pattern 14 with a line width (L/S) of 0.5 $\mu$m and film thickness of 1 $\mu$m by forming a pattern of the photoresist by a photolithography process as shown in FIG. 3C.

Figure 3D:
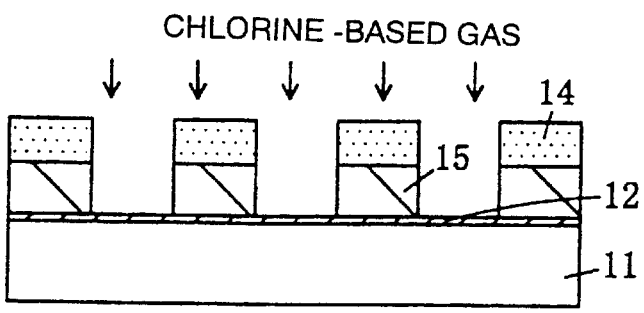

The electrode film 13 is removed by the reactive ion etching using the resist pattern 14 as a mask. The first reactive ion etching step is carried out with a parallel plate RIE apparatus using a mixed gas with a composition of ($BCl_3+Cl_2+N_2$). It is needless to say that a high density plasma source such as ICP, ECR and Helicon may be used instead of the parallel plate RIE apparatus. An over-etching time corresponding to 30% of the overall etching time was used for the first reactive ion etching step. The electrode film 13 consisting of Al-1 wt %Cu is thus dry-etched, obtaining the lower electrodes with a prescribed pattern as shown in FIG. 3D.

Since the etching rate of the base film 12 made of tungsten with the chlorine-based gas (chlorine plasma) is one tenth or less slower than the etching rate of the electrode film 13 consisting of Al-1 wt %Cu, the base film 12 is hardly etched. Accordingly, residues of the electrode film 13 is completely removed by the sufficient over-etching treatment. Since the $LiTaO_3$ substrate 11 is not exposed at the portions where the electrode film 13 is removed, the $LiTaO_3$ substrate 11 is protected with the base film 12 to prevent the plate from being damaged when the reactive ion etching with a mixed gas containing the chlorine-based gas is applied.

Figure 3E:
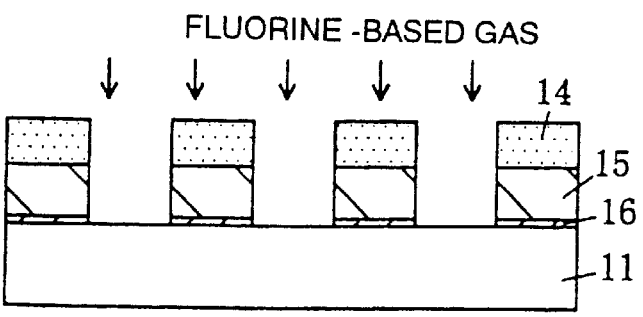

After completely evacuating the mixed gas of ($BCl_3+Cl_2+N_2$) from the chamber of the RIE apparatus and before exposing the $LiTaO_3$ substrate 11 to the air, it is subjected to the reactive ion etching with the fluorine-based gas to remove the base film 12 as shown in FIG. 3E. The reactive ion etching in the second step is applied with the parallel plate RIE apparatus using a mixed gas of $CF_4+O_2$. The over-etching time also corresponded to 30% of the overall etching time. The base film 12 is thus dry-etched, giving a pattern of the lower electrode 16 with the same configuration as that of the upper electrode 15 as shown in FIG. 3E.

When the substrate layer 12 is removed to completely expose the LiTaO$_3$ substrate 11, residues of the substrate layer 12 can be thoroughly removed by a sufficient over-etching treatment since the LiTaO$_3$ substrate 11 is not chemically damaged with the mixed gas with a composition of CF$_4$+O$_2$.

Figure 3F:
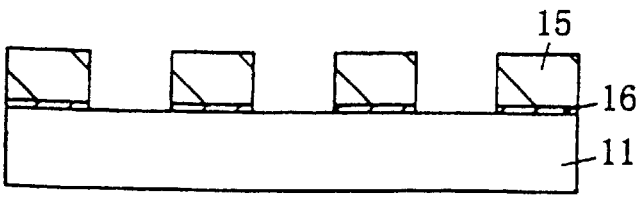

A comb-teeth shaped dual layer electrode consisting of the lower electrode 16 (tungsten) and upper electrode 15 (Al-1 wt %Cu) as shown in FIG. 3F is obtained by washing after removing the resist pattern 14 with a resist peeling solution. This substrate (mother board) is cut-off, assembled and wired to obtain the acoustic surface wave device.

As hitherto described, good device characteristics can be obtained in the foregoing embodiment irrespective of applying a sufficient over-etching treatment in the first and second reactive ion etching steps. In the conventional art, on the other hand, the substrate is chemically damaged with the chlorine plasma when subjected to an over-etching treatment of as large as 30%, resulting in severe deterioration of the device characteristics (such as insertion loss).

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for manufacturing an electronic device, comprising the steps of:

providing a piezoelectric material substrate having a base film on a surface thereon, said base film comprising a material capable of reactive-ion etching with a fluorine-based gas, and wherein the base film contains at least one element selected form the group consisting of Si, Mo, W, B, C, S and Ta;

forming a cover film comprising a material capable of reactive-ion etching with a chlorine-based gas on the base film, the cover film containing at least one element selected from the group consisting of Al, Cu, Ti, Cr, Ga, As, Sc, Nb, Ru, In, Sn, Sb, Ta and Au;

forming a mask having a predetermined pattern on the cover film;

etching the cover film by chlorine-based gas reactive ion etching; and etching the base film exposed by etching of the cover film by fluorine-based gas reactive ion etching.

2. A method according to claim 1, wherein the base film has a thickness of about 0.5 nm to 1000 nm.

3. A method according to claim 2, wherein the base film has a thickness of about 1–500 nm.

4. A method according to claim 3, wherein the substrate is selected from the group consisting of a single crystal substrate, single crystal film, triaxial orientation film and uniaxial orientation film.

5. A method according to claim 1, wherein the base film has a thickness of about 1–500 nm.

6. A method according to claim 1, wherein the substrate is selected from the group consisting of a single crystal substrate, single crystal film, triaxial orientation film and uniaxial orientation film.

* * * * *